United States Patent [19]

Mogro-Campero et al.

[11] Patent Number: 4,882,312

[45] Date of Patent: Nov. 21, 1989

[54] EVAPORATION OF HIGH TC Y-BA-CU-O SUPERCONDUCTING THIN FILM ON SI AND SIO2 WITH A ZIRCONIA BUFFER LAYER

[75] Inventors: Antonio Mogro-Campero; Larry G. Turner, both of Schenectady, N.Y.

[73] Assignee: General Electric Company, Schenectady, N.Y.

[21] Appl. No.: 192,039

[22] Filed: May 9, 1988

[51] Int. Cl.$^4$ .................. B05D 5/12; C23C 14/08; C23C 14/24

[52] U.S. Cl. .................. 505/1; 427/62; 427/63; 427/126.3; 427/255.3; 428/697; 428/701

[58] Field of Search ............ 427/62, 63, 255.3, 126.3, 427/124; 204/192.11, 192.24, 192.32, 298; 505/1, 818, 819; 428/697, 701

[56] References Cited

U.S. PATENT DOCUMENTS 4,395,813  8/1983  Roth et al. ..................... 427/62

OTHER PUBLICATIONS

Lee et al., "Microprobe Characterization of Sputtered High Tc Superconducting Films on Silicon", AIP Conf. Proc. No. 165 P. 427 (1988).

Naito et al., "High-Tc Superconductors-Thin-Film Synthesis of the High-Tc Oxide Superconductor YBa2Cu3O7 by Electron-Beam Codeposition", J. Mater. Res. 2(6), p. 713, 1987.

Qiu et al., "Y-Ba-Cu-O thin films prepared by a multilayer vacuum method", Appl Phys. Lett. 52(7), p. 587, 1988.

Chien et al., "Effect of noble metal buffer layers on superconducting YBa2Cu3O7 thin films", Appl. Phys. Lett. 51(25), p. 2155 (1987).

Ovshinsky et al., "Superconductivity at 155 K", Physical Review Letters, vol. 58, No. 24, p. 2579 (1987).

Politis et al., "Preparation and superconducting properties of La1.8Sr0.2CuO4 and YBa2Cu3O6.5", MRS edited by Gubser et al., Proc. Sym. Extended Abstracts, p. 141 (1987).

Hammond et al., "Superconducting films of the Perovskite superconductors by electron-beam deposition", MRS Extended Abstract edited by Gubser et al., p. 169 (1987), Apr. 23.

Lee et al., "Microprobe Characterization of Sputtered High Tc Superconducting Films on Silicon", AIP No. 165 (Anaheim, CA), Nov. 1987, pp. 427–434.

Naito et al., "Thin-Film Synthesis of the High-Tc Oxide Superconductor YBa2Cu3O7 by Electron-Beam Codeposition", J. Mater. Res. 2(6), Nov./Dec. 1987, pp. 713–725.

Mankiewich et al., "High critical-current density Ba2YCU3O7 thin films produced by coevaporation of Y, Cu, and BaF2", MRS, vol. 99, Nov. 1987, (Boston, MA), pp. 119–125.

"High-T$_C$ Superconductors-Thin-Film Synthesis of the High-T$_c$ Oxide Superconductor Yba2Cu3O7 by Electron-Beam Codeposition", M. Naito et al., J. Mater. Res. 2(6), Nov./Dec. 1987.

Abstract-American Vacuum Society-Nov. 2-6, 1987-"Microprobe Characterization of Sputtered High T$_c$ Superconducting Films on Si and SiTiO3", S. Y. Lee et al.

"Thin Films of Y-Ba-Cu-O" on Silicon and Silicon Dioxide, A. Mogro-Campero and L. G. Turner, Jan. 1988.

"Superconducting Y-Ba-Cu-O Thin Films By Evaporation", A. Mogro-Campero et al., High Temperature Superconductors II, Materials Research Society, Apr. 5, 1988.

"Microprobe Characterization of Sputtered High T$_c$ Superconducting Films on Silicon", S. Y. Lee et al., American Institute of Physics, Apr. 1988.

*Primary Examiner*—Norman Morganstern
*Assistant Examiner*—Roy V. King
*Attorney, Agent, or Firm*—Jane M. Binkowski; James C. Davis, Jr.; James Magee, Jr.

[57] ABSTRACT

A superconducting thin film of YBaCuO having a zero resistance transition temperature of at least about 38K is deposited by evaporation on a silicon-containing substrate with a zirconia buffer layer between the film and the substrate.

31 Claims, No Drawings

EVAPORATION OF HIGH TC Y-BA-CU-O SUPERCONDUCTING THIN FILM ON SI AND SIO₂ WITH A ZIRCONIA BUFFER LAYER

This invention relates to the production of Y-Ba-Cu-O superconductive film preferably on a silicon-containing substrate by providing a barrier layer of zirconium dioxide intermediate the superconductive film and substrate.

Single crystal silicon is the primary electronic material. Deposition of high temperature superconductors on silicon is of interest for a variety of electronic applications. Possible uses of superconductors on silicon range from passive roles such as interconnects to hybrid semiconductor/superconductor devices. For example, chips might employ superconducting lines to interconnect their different functions, dramatically speeding up the rate at which they could process data. This could result in significant improvements in the performance of high-frequency and high-speed circuits.

Deposition of the high temperature superconductor Y-Ba-Cu-O where the desired atomic ratios of the superconducting phase are Y:Ba:Cu=1:2:3 directly on silicon is not advantageous due to the high temperature required to form the superconducting orthorhombic crystal structure. The high temperature leads to the interdiffusion of elements. Interdiffusion into the superconducting film can degrade or destroy superconductivity, but a more restrictive condition is imposed by the sensitivity of microelectronic devices to impurities. The components of the superconductor are undesirable contaminants to be kept out of the silicon crystal.

The present invention overcomes the interdiffusion problem by using a zirconium dioxide buffer or barrier layer between the substrate and the superconducting film. This buffer serves as an effective diffusion barrier, preventing the elements from intermingling during the annealing process.

Briefly stated, the present composite is comprised of a crystalline superconductive film, a continuous microscopically pore-free zirconium dioxide film and a substrate, said superconductive film having a composition represented by the formula $YBa_xCu_yO_z$ where x ranges from about 1.7 to about 2.3, where y ranges from about 2.7 to about 3.3 and where z ranges from about 6.5 to about 7.0, said superconductive film having a zero resistance transition temperature of at least about 38 K and a thickness at least sufficient to be continuous, said substrate being selected from the group consisting of elemental silicon, oxidized silicon, silicon dioxide and aluminum oxide, said zirconium dioxide film being intermediate said superconductive film and said substrate, said zirconium dioxide film having a thickness greater than about 0.2 microns.

Briefly stated, the present process comprises depositing a microscopically pore-free film of zirconium dioxide on the substrate in a partial vacuum, depositing on the zirconium dioxide film in a partial vacuum a precursor film containing Y, Ba and Cu in the amounts required for the superconductive film, annealing the resulting structure in oxygen at about atmospheric pressure at a temperature ranging from about 400° C. to about 950° C. for a time sufficient to incorporate oxygen into the precursor film and produce the orthorhombic crystal structure in an amount sufficient to produce the superconductive film, and cooling the resulting structure in oxygen at about atmospheric pressure at a rate which produces the superconductive film, said zirconium dioxide film having a thickness at least sufficient to prevent interdiffusion between said precursor film and substrate during said annealing, said superconductive film having a thickness at least sufficient to be continuous.

In another embodiment, a precursor film comprised of Y, Ba, Cu and O is deposited on the zirconium dioxide film which contains Y, Ba and Cu in the amounts required for the superconductive film and which can contain O in an amount ranging to that required for the superconductive film, and the resulting structure is annealed in oxygen to incorporate and/or maintain O to produce the orthorhombic crystal structure in an amount sufficient to produce the superconductive film.

The present substrate is selected from the group consisting of monocrystalline or polycrystalline elemental silicon, oxidized monocrystalline or polycrystalline elemental silicon, amorphous silicon dioxide, and monocrystalline or polycrystalline aluminum oxide. The oxidized silicon generally is comprised of elemental silicon with an oxidized surface and is commercially available.

The substrate is a solid which is inert or at least substantially inert under the conditions of the present process. The size and shape of the substrate is not critical. For example, it can be in the form of a tape, foil, wire or plate. Generally, it is rigid. Usually, for microelectronic applications, it is in the form of a plate of uniform or substantially uniform thickness ranging from about 300 microns to about 500 microns.

The substrate surface on which the zirconium dioxide film is to be deposited preferably is smooth or at least substantially smooth. Generally, it is flat or substantially flat. Preferably, the substrate deposition surface is mechanically or chemically polished to produce a smooth surface. Before use, the substrate should be cleaned of surface impurities using conventional techniques.

The films can be deposited by a number of known techniques such as, for example, sputtering, evaporation or laser ablation. All of these techniques require that the films be deposited below atmospheric pressure, i.e. in a partial vacuum, and such deposition can be carried out in a conventional vacuum chamber. The partial vacuum should be effective for depositing the film and is determinable empirically depending largely on the particular deposition technique. The partial vacuum may or may not contain oxygen. Generally, for evaporation deposition of films, the pressure is no greater than about $10^{-3}$ torr, and typically it ranges from about $10^{-5}$ to about $10^{-6}$ torr. For deposition of films by sputtering, the pressure typically ranges from about $10^{-2}$ to about $10^{-1}$ torr. With the laser ablation technique, the pressure typically ranges from about $10^{-7}$ to about $10^{-5}$ torr.

Generally, zirconium dioxide is used as the source for depositing the zirconium dioxide film. Zirconium dioxide is deposited on the substrate in a thickness sufficient to produce a continuous and microscopically pore-free film. Also, the zirconium dioxide film should be sufficiently thick to prevent interdiffusion between the substrate and the precursor superconductive film during the present annealing. Such thickness is determined empirically and depends largely on the particular annealing temperature, with thicker zirconium dioxide films being required at higher temperatures. Generally, the zirconium dioxide film ranges in thickness from about 30 Angstroms to about 10,000 Angstroms, frequently from about 2,000 Angstroms to about 4,000

Angstroms. Typically, the zirconium dioxide film having a thickness of about 2,000 Angstroms is sufficient as a barrier at a temperature of about 850° C.

The precursor film, i.e. the film used to form the superconductive film, can be comprised of a single layer or a plurality of layers. It always contains yttrium, barium and copper in amounts required for the superconductive film, i.e. in the ratios set forth herein for the superconductive film. Prior to annealing, the precursor film may or may not contain oxygen. If desired, prior to annealing, it may contain oxygen in an amount ranging to the amount required for the superconductive film.

Conventional sources can be used to deposit the components of the precursor film, i.e. to form the precursor film. For example, elemental metal or a ceramic powder can be used as sources. The particular source depends largely on the material being deposited and conditions of deposition. Generally, elemental metals are used as sources for evaporation or sputtering of Y, Ba and Cu. In a preferred embodiment, barium fluoride is used as a source for evaporation of Ba and in such instance fluorine also is deposited.

Deposition can be carried out to produce a precursor film comprised of a single layer or a plurality of layers, preferably a stack of layers. Generally, to deposit a single layered film by evaporation, the zirconium dioxide film is protected with conventional protective means, a flux of Ba, Cu and Y in the required ratios is formed, the protective means is removed and the flux is impinged on the zirconium dioxide film. Generally, to deposit a multi-layered film by evaporation or sputtering using metals as sources, an individual layer of Ba, Cu and Y is deposited, and frequently, the deposition of such three-layered stacked structure is repeated to produce a desired thickness or composition.

In one embodiment, deposition is carried out in a partial vacuum free of oxygen. If desired, oxygen can be introduced into the film by known techniques. For example, oxygen ions can be impinged on the film by using an ionization technique such as by introducing a plasma of oxygen ions into the vacuum chamber.

In another embodiment, deposition is carried out in a partial vacuum containing a partial pressure of oxygen. In this instance, where metals are being deposited, generally some oxide also is deposited. Ordinarily, the particular amount of deposited oxide depends largely on the partial pressure of oxygen which generally ranges from about $10^{-5}$ torr to about $10^{-3}$ torr.

The resulting structure, or more particularly the precursor film, is annealed in an atmosphere of oxygen at or about atmospheric pressure for a period of time sufficient to produce the orthorhombic crystal structure in an amount at least sufficient to produce the superconductive film. During annealing, oxygen is incorporated into the precursor film, some is lost from the film but sufficient oxygen is maintained in the film to permit formation of the required orthorhombic structure. During annealing, if the precursor film is comprised of a plurality of layers, it is transformed into a single layered film. Annealing has no significant effect on the amounts of Y, Ba and Cu components of the film.

When the precursor film contains fluorine, the annealing atmosphere is comprised of oxygen and water vapor wherein the water vapor is sufficient to remove at least a major portion of the fluorine. Generally, the water vapor is present only at the maximum annealing temperature. Generally, such a wet oxygen atmosphere is produced by saturating oxygen with water at room temperature. Usually, however, the resulting annealed film contains fluorine in a significant amount, generally ranging from about 1 atomic % to about 7 atomic %, and frequently, it is about 4 atomic %, of the total composition of the resulting superconductive film.

Annealing temperature ranges from about 400° C. to 950° C., preferably from about 450° C. to about 850° C. and frequently it is about 850° C. Annealing time depends largely on temperature with lower annealing temperatures requiring longer times.

The resulting annealed structure is cooled in an atmosphere of oxygen at or about atmospheric pressure at a rate which produces the superconductive film. The rate of cooling should be slow enough to prevent significant loss of oxygen from the annealed film or to incorporate oxygen into the annealed film to produce the required, or a desired, superconductive composition. Such rate of cooling is determinable empirically. Generally, however, a cooling rate of less than about 5° C. per minute, preferably less than about 3° C. per minute, is used. The specimen usually is cooled to room temperature, i.e. from about 20° to about 30° C.

In another embodiment of the present process, the present composite is produced by depositing a microscopically pore-free film of zirconium dioxide on the substrate in a partial vacuum, heating the resulting film-carrying substrate in a partial vacuum to an annealing temperature ranging from about 400° C. to about 950° C., depositing on the zirconium dioxide film a precursor film containing Y, Ba, Cu and O in amounts required for the superconductive film, said heating being sufficient to produce the orthorhombic crystal structure in the precursor film in an amount sufficient to produce the superconductive film, and cooling the resulting structure in oxygen at about atmospheric pressure at a rate which produces the superconductive film, said zirconium dioxide film having a thickness at least sufficient to prevent interdiffusion between said precursor film and substrate during said heating, said superconductive film having a thickness at least sufficient to be continuous. In this embodiment, if the precursor film contains fluorine, the structure would have to be further annealed in a wet oxygen atmosphere, again generally oxygen saturated with water at room temperature, to remove at least a major portion of the fluorine.

The present composite is comprised of the superconductive film, a zirconium dioxide film and a substrate. The zirconium dioxide film is intermediate the superconductive film and the substrate. Preferably, the zirconium dioxide film is coextensive with the supporting surface of the substrate. Preferably, the superconductive film is coextensive with the zirconium dioxide film. In the present composite, there is no direct contact between the superconductive film and the substrate.

The superconductive film is comprised of $YBa_xCu_yO_z$ where x ranges from about 1.7 to about 2.3, where y ranges from about 2.7 to about 3.3 and where z ranges from about 6.5 to about 7.0. In a preferred embodiment, x ranges from about 1.9 to about 2.1, y ranges from about 2.9 to about 3.1 and z ranges from about 6.9 to about 7.0.

The present superconductive film contains the orthorhombic crystal structure in an amount at least sufficient to give the desired zero resistance transition temperature. Generally, the presence of the orthorhombic phase can be determined by a combination of x-ray diffraction analysis and transmission electron microscopy. The superconductive film is monocrystalline or polycrystalline. The crystal structure can be determined by a number of conventional techniques such as, for example, x-ray diffraction analysis.

The particular thickness of the superconductive film depends largely on its use but it should be at least sufficiently thick to be continuous. Generally, the film has a thickness of at least about 0.2 micron, ranging from about 0.2 micron to about about 3 microns, frequently from about 0.3 micron to about 1 micron or from about 0.4 micron to about 0.5 micron.

The superconductive film has a zero resistance transition temperature, i.e. a temperature at which there is no electrical resistance, of at least about 38 K, preferably greater than about 77 K and more preferably, at least about 83 K.

The present composite is useful as a component in a microelectronic circuit.

The invention is further illustrated by the following examples wherein the procedure was as follows unless otherwise noted:

The substrates were cut from standard single crystal silicon wafers or oxidized silicon wafers. The oxidized silicon wafer was comprised of single crystal elemental silicon totally enveloped by an oxidized layer 0.8 microns in thickness. The oxidized layer was comprised of silicon dioxide.

Each substrate was rectangular $\frac{1}{4} \times \frac{3}{4}$ inch and about 0.02 inch in thickness.

Before use, each substrate was ultrasonically cleaned in organic solvents, rinsed with isopropyl alcohol and blow dried with nitrogen at room temperature.

Evaporation was by electron beam.

Deposition was carried out in a standard vacuum chamber provided with a source of oxygen. The substrate was affixed above the evaporation source so that a face thereof served as the deposition surface. The evaporation sources were placed within the chamber and rotated sequentially to a position as closely perpendicular to the substrate as possible, about 40 cm from the substrate.

Annealing was carried out in a quartz tube furnace.

Annealing was carried out in an atmosphere of oxygen at about atmospheric pressure.

The samples were cooled to room temperature in an atmosphere of oxygen at about atmospheric pressure.

Electrical resistance was determine by a four-point probe dc measurement in a liquid helium dewar, and the temperature was monitored with a platinum resistance thermometer. Pressure contacts were made for resistance measurements, so that samples could be reannealed and remeasured. The transition temperatures given correspond to zero resistance.

Stoichiometry (normalized to Y=1) was determined by inductively coupled plasma emission spectroscopy performed on unannealed samples.

EXAMPLE 1

The substrate was oxidized silicon.

$ZrO_2$, Y, Ba, and Cu were used as evaporation sources.

The chamber was evacuated to produce an evacuated chamber with a residual pressure no greater than about $10^{-5}$ torr and such residual pressure was maintained throughout all of the vapor depositions.

The zirconium dioxide was evaporated onto the substrate to produce a film with a thickness of about 0.4 microns. The film covered the entire face of the substrate and from other work it was known that it was microscopically pore-free.

Sequential layers of Cu, Ba and Y of 21.4, 77 and 20 nanometers thickness, respectively, were evaporated on the zirconium dioxide film and this sequence of metals was repeated six times to form an 18-layer stack with a total thickness of 0.6 micron. The 18-layer stack of another specimen prepared simultaneously in the same manner was determined to have the overall composition of $YBa_{1.9}Cu_{3.5}$.

The resulting structure was annealed immediately after deposition in an oxygen ambient at atmospheric pressure at 800° C. for five minutes and cooled at 2° C. per minute.

The superconductive film had a zero resistance transition temperature of 38 K. The presence of the orthorhombic structure was inferred from resistance measurements. The superconductive film was comprised of a single layer which was continuous, appeared to be pore-free, and had a thickness of about 0.6 microns.

Further annealing for five minutes at 850° C. and cooling at the same rate increased the transition temperature to 47 K.

EXAMPLE 2

This example was carried out in substantially the same manner as Example 1 except as noted herein.

Barium fluoride was used instead of barium as the evaporation source. A controlled leak of oxygen was introduced into the chamber, which raised the residual pressure to about $10^{-5}$ torr.

Before annealing, the 18-layer stack of another specimen prepared simultaneously in the same manner was determined to have the overall composition of $YBa_{1.8}Cu_{3.0}$.

The annealing atmosphere was at about atmospheric pressure. It was comprised of oxygen until the annealing temperature of 850° C. was reached. Wet oxygen was then introduced, i.e. oxygen which had been saturated with water at room temperature, and the specimen was annealed in the wet atmosphere at 850° C. for 3.5 hours. It was then cooled only in oxygen at a rate of about 5° C. per minute to about 550° C. where it was held for about 30 minutes and then cooled to room temperature at about 2° C. per minute.

The superconductive film had a zero resistance transition temperature of 83 K. The presence of the orthorhombic crystal structure was inferred from resistance measurements. The superconductive film was comprised of a single layer which was continuous, appeared to be essentially pore-free, and had a thickness of about 0.5 microns.

An elemental depth profile by x-ray photoelectron spectroscopy of another specimen prepared simultaneously in the same manner showed no interdiffusion between the superconductive film and the substrate, and the superconductive film contained about 4 atomic % fluorine throughout the film thickness.

What is claimed is:

1. A process for producing a composite consisting essentially of a substrate, a zirconium dioxide film and a superconductive film having a composition represented by the formula $YBa_xCu_yO_z$ where x ranges from about 1.7 to about 2.3, where y ranges from about 2.7 to about 3.3 and where z ranges from about 6.5 to about 7.0, said superconductive film having a zero resistance transition temperature of at least about 38 K, which consists essentially of providing a substrate selected from the group consisting of elemental silicon, oxidized elemental silicon, silicon dioxide and aluminum oxide, depositing a microscopically pore-free film ranging in thickness from about 2000 Angstroms to about 4000 Angstroms of zirconium dioxide on the substrate in a partial vacuum, depositing by evaporation on the zirconium dioxide film in a partial vacuum a precursor film containing Y, Ba and Cu said amounts in said superconductive film, annealing the resulting structure in oxygen at about atmospheric pressure at a temperature ranging from about 450° C. to about 850° C. for a time sufficient to incorporate oxygen into the precursor film and produce the orthorhombic crystal structure in an amount sufficient to produce the superconductive film, and cooling the resulting structure in oxygen at about atmospheric pressure at a rate of less than about 5° C. per minute which produces the superconductive film, said zirconium dioxide film having a thickness at least sufficient to prevent interdiffusion between said precursor film and substrate during said annealing, said superconductive film having a thickness ranging from about 0.3 micron to about 1 micron.

2. The process according to claim 1 wherein individual layer of Y, Ba and Cu are deposited.

3. The process according to claim 1 wherein said deposition of $ZrO_2$ is carried out by evaporation.

4. The process according to claim 1 wherein said deposition of $ZrO_2$ is carried out by sputtering.

5. The process according to claim 1 wherein said precursor film contains an oxide of metal selected from the group consisting of Ba, Cu and Y.

6. The process according to claim 1 wherein said partial vacuums are free of oxygen.

7. The process according to claim 1, wherein said precursor film is deposited in a partial vacuum containing a partial pressure of oxygen ranging from about $10^{-5}$ to about $10^{-3}$ torr and prior to said annealing the precursor film contains oxygen.

8. The process according to claim 1 wherein each said partial vacuum is no greater than about $10^{-3}$ torr.

9. The process according to claim 1, wherein barium fluoride is used as a source of Ba, wherein the precursor film contains fluorine, wherein said annealing is carried out in a wet atmosphere of oxygen at about atmospheric pressure at the maximum annealing temperature used, and wherein fluorine ranges from about 1 atomic % to about 7 atomic % of the total composition of the resulting superconductive film.

10. The process according to claim wherein said substrate is single crystal elemental silicon.

11. A process for producing a composite consisting essentially of a substrate, a zirconium dioxide film and a superconductive film having a composition represented by the formula $YBa_xCu_yO_z$ where x ranges from about 1.7 to about 2.3, where y ranges from about 2.7 to about 3.3 and where z ranges from about 6.5 to about 7.0, said superconductive film having a zero resistance transition temperature of at least about 38 K, which consists essentially of providing a substrate selected from the group consisting of elemental silicon, oxidized elemental silicon, silicon dioxide and aluminum oxide, depositing a microscopically pore-free film ranging in thickness from about 2000 Angstroms to about 4000 Angstroms of zirconium dioxide on the substrate in a partial vacuum, heating the resulting film-carrying substrate in a partial vacuum to an annealing temperature ranging from about 450° C. to about 850° C, depositing by evaporation on the zirconium dioxide film Y, Ba, Cu and O in amounts required for the superconductive film, said heating being sufficient to produce the orthorhombic crystal structure in an amount sufficient to produce the superconductive film, and cooling the resulting structure in oxygen at about atmospheric pressure at a rate of less than about 5° C. per minute which produces the superconductive film, said zirconium dioxide film having a thickness at least sufficient to prevent interdiffusion between said precursor film and substrate during said heating, said superconductive film having a thickness ranging from about 0.3 micron to about 1 micron.

12. The process according to claim 1, wherein x ranges from about 1.9 to about 2.1, y ranges from about 2.9 to about 3.1, and z ranges from about 6.9 to about 7.0.

13. The process according to claim 1, wherein said substrate has a thickness ranging from about 300 microns to about 500 microns.

14. The process according to claim 1, wherein said substrate is polycrystalline elemental silicon.

15. The process according to claim 1, wherein said substrate is oxidized monocrystalline elemental silicon.

16. The process according to claim 1, wherein said substrate is oxidized polycrystalline elemental silicon.

17. The process according to claim 1, wherein said substrate is amorphous silicon dioxide.

18. The process according to claim 1, wherein said substrate is monocrystalline aluminum oxide.

19. The process according to claim 1, wherein said substrate is polycrystalline aluminum oxide.

20. The process according to claim 1, wherein said superconductive film has a thickness ranging from about 0.4 micron to about 0.5 micron.

21. A process for producing a composite consisting essentially of a substrate, a zirconium dioxide film and a superconductive film having a composition represented by the formula $YBa_xCu_yO_z$, where x ranges from about 1.9 to about 2.1, where y ranges from about 2.9 to about 3.1, and where z ranges from about 6.9 to about 7.0, said superconductive film having a zero resistance transition temperature of at least about 38 K, which consists essentially of providing a substrate selected from the group consisting of elemental silicon, oxidized elemental silicon, silicon dioxide and aluminum oxide, depositing a micronscopically pore-free film ranging in thickness from about 2000 Angstroms to about 4000 Angstroms of zirconium dioxide on the substrate in a partial vacuum, depositing by evaporation on the zirconium dioxide film in a partial vacuum a precursor film containing Y, Ba, and Cu in said amounts in said superconductive film, annealing the resulting structure in oxygen at about atmospheric pressure at a temperature ranging from about 450° C. to about 850° C. for a time sufficient to incorporate oxygen into the precursor film and produce the orthorhombic crystal structure in an amount sufficient to produce the superconductive film, and cooling the resulting structure in oxygen at about atmospheric pressure at a rate of less than about 5° C. per minute which produces the superconductive film, said zirconium dioxide film having a thickness at least sufficient to prevent interdiffusion between said precursor film and substrate during said annealing, said superconductive film having a thickness ranging from about 0.4 micron to about 0.5 micron.

22. The process according to claim 21, wherein individual layers of Y, Ba, and Cu are deposited.

23. The process according to claim 21, wherein said substrate has a thickness ranging from about 300 microns to about 500 microns.

24. The process according to claim 21, wherein said substrate is single crystal elemental silicon.

25. The process according to claim 21, wherein said substrate is polycrystalline elemental silicon.

26. The process according to claim 21, wherein said substrate is oxidized monocrystalline elemental silicon.

27. The process according to claim 21, wherein said substrate is oxidized polycrystalline elemental silicon.

28. The process according to claim 21, wherein said substrate is amorphous silicon dioxide.

29. The process according to claim 21, wherein said substrate is monocrystalline aluminum oxide.

30. The process according to claim 21, wherein said substrate is polycrystalline aluminum oxide.

31. The process according to claim 21, wherein barium fluoride is used as a source of Ba, wherein the precursor film contains fluorine, wherein said annealing is carried out in a wet atmosphere of oxygen at about atmospheric pressure at the maximum annealing temperature used, and wherein fluorine ranges from about 1 atomic % to about 7 atomic % of the total composition of the resulting superconductive film.

* * * * *